US 9,633,750 B2

(12) United States Patent
Park et al.

(10) Patent No.: US 9,633,750 B2
(45) Date of Patent: Apr. 25, 2017

(54) SEMICONDUCTOR DEVICE FOR PERFORMING REPAIR OPERATIONS

(71) Applicant: SK hynix Inc., Icheon-si, Gyeonggi-do (KR)

(72) Inventors: Min Su Park, Seoul (KR); Jae Il Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/975,275

(22) Filed: Dec. 18, 2015

(65) Prior Publication Data

US 2017/0084353 A1 Mar. 23, 2017

(30) Foreign Application Priority Data

Sep. 18, 2015 (KR) .................. 10-2015-0132538

(51) Int. Cl.
| | |
|---|---|
| G11C 29/00 | (2006.01) |
| G11C 17/16 | (2006.01) |
| G11C 11/406 | (2006.01) |
| G11C 11/4091 | (2006.01) |
| G11C 11/408 | (2006.01) |

(52) U.S. Cl.
CPC .......... *G11C 29/78* (2013.01); *G11C 11/406* (2013.01); *G11C 11/4087* (2013.01); *G11C 11/4091* (2013.01); *G11C 17/16* (2013.01)

(58) Field of Classification Search
CPC ....... G11C 29/78; G11C 29/787; G11C 17/16; G11C 11/406; G11C 11/4087; G11C 11/4091
USPC ........................................ 365/96, 225.7, 200
See application file for complete search history.

(56) References Cited

U.S. PATENT DOCUMENTS

| | | | |
|---|---|---|---|
| 4,727,516 A | 2/1988 | Yoshida et al. | |
| 6,532,181 B2 | 3/2003 | Saito et al. | |
| 6,657,907 B2 | 12/2003 | Lee | |
| 7,313,036 B2 | 12/2007 | Kim | |
| 8,102,689 B2 | 1/2012 | Hong et al. | |
| 2013/0322160 A1* | 12/2013 | Kim ................. | G11C 29/04 365/154 |
| 2014/0157065 A1 | 6/2014 | Ong | |
| 2015/0003141 A1* | 1/2015 | Son ................. | G11C 29/785 365/96 |
| 2015/0074494 A1* | 3/2015 | Shim ................ | G11C 29/808 714/768 |
| 2015/0113342 A1 | 4/2015 | Jung et al. | |

FOREIGN PATENT DOCUMENTS

| | | |
|---|---|---|
| KR | 100876807 B1 | 1/2009 |
| KR | 1020100053203 A | 5/2010 |
| KR | 1020140001483 A | 1/2014 |

* cited by examiner

*Primary Examiner* — Tha-O H Bui
*Assistant Examiner* — Alfredo Bermudez Lozada
(74) *Attorney, Agent, or Firm* — William Park & Associates Ltd.

(57) ABSTRACT

A semiconductor device includes a fuse block configured to store repair information corresponding to a fail address, and output fuse data in a boot-up operation; a dummy mat formed in a predetermined region of a cell array, and configured to store the fuse data in the boot-up operation; and a repair latch block configured to store the fuse data in the boot-up operation, wherein the fuse data stored in the dummy mat are updated to and stored in the repair latch block in a refresh operation.

19 Claims, 6 Drawing Sheets

US 9,633,750 B2

SEMICONDUCTOR DEVICE FOR PERFORMING REPAIR OPERATIONS

CROSS-REFERENCES TO RELATED APPLICATION

The present application claims priority under 35 U.S.C. §119(a) to Korean Patent Application No. 10-2015-0132538, filed on Sep. 18, 2015, in the Korean Intellectual Property Office, which is incorporated herein by reference in its entirety.

BACKGROUND

1. Technical Field

Various embodiments generally relate to a semiconductor device, and more particularly, to a semiconductor device including dummy mats.

2. Related Art

In general, a semiconductor memory device such as a double data rate synchronous DRAM (DDR SDRAM) includes a large number of memory cells. The number of memory cells gradually increases as processing technologies have developed and thus the degree of integration has been augmented. If even any one among such memory cells fails, a semiconductor memory device including the failed memory cell is discarded because the semiconductor device may not be able to perform all required operations.

Recently, as processing technologies for manufacturing semiconductor memory devices has developed, failures occur probabilistically in only a small number of memory cells. When considering a manufacturing yield, it is inefficient to discard an entire semiconductor memory device as a bad product due to such a small number of fails.

Thus, in order to cope with this problem, redundancy memory cells are included in a semiconductor memory device in addition to normal memory cells.

A redundancy memory cell is a circuit which repairs a failed memory cell (hereinafter, referred to as a "repair target memory cell") when a failure occurs in a normal memory cell.

More specifically, for example, in read and write operations, when a target memory cell is repaired, not the repaired target memory cell but a normal memory cell is accessed internally. In this case, the accessed memory cell is a redundancy memory cell.

Accordingly, when an address corresponding to a repair target memory cell is inputted a semiconductor memory device, the semiconductor memory device performs an operation for accessing a redundancy memory cell (hereinafter, referred to as a "repair operation") and not the repair target memory cell. Through such a repair operation, the semiconductor memory device is ensured normal operation.

A redundancy circuit for a repair operation is generally included in each of a plurality of banks which are included in a semiconductor memory device. Each bank includes a cell mat which is configured by a plurality of unit cells, a row control region which includes circuits for controlling row accesses, and a column control region which includes circuits for controlling column accesses.

The redundancy circuit includes a row redundancy circuit for repairing the row address of a failed unit cell, and a column redundancy circuit for repairing the column address of the failed unit cell. The row redundancy circuit and the column redundancy circuit are respectively included in the row control region and the column control region of each bank.

SUMMARY

Various embodiments are directed to a semiconductor device capable of preventing an occurrence of a soft error or storing column repair information, by using dummy mats.

In an embodiment, a semiconductor device may include: a fuse block configured to store repair information corresponding to a failure address, and output fuse data in a boot-up operation; a dummy mat formed in a predetermined region of a cell array, and configured to store the fuse data in the boot-up operation; and a repair latch block configured to store the fuse data in the boot-up operation, wherein the fuse data stored in the dummy mat are updated to and stored in the repair latch block in a refresh operation.

In an embodiment, a semiconductor device may include: a fuse block configured to store repair information corresponding to a failure address, and output fuse data in a boot-up operation; a dummy mat formed in a predetermined region of a cell array, and configured to store the fuse data in the boot-up operation; and a repair latch block configured to store the fuse data applied from the dummy mat by a specific column repair unit corresponding to a read signal when an active signal is enabled.

According to the embodiments, it is possible to prevent occurrence of a soft error or store column repair information, by using dummy mats.

DETAILED DESCRIPTION

Hereinafter, a semiconductor device will be described below with reference to the accompanying drawings through various examples of embodiments.

Figure 1:
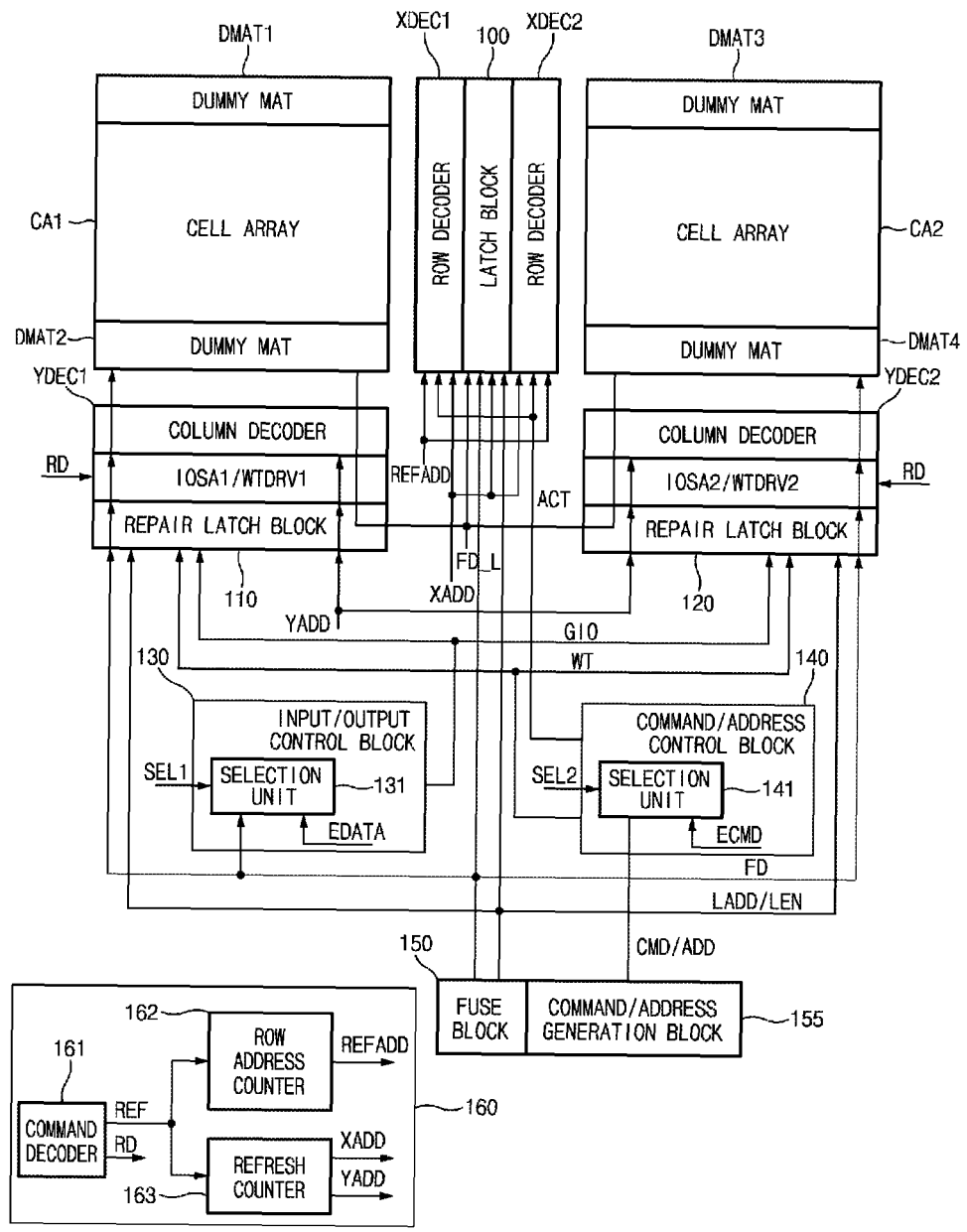
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

A semiconductor device in accordance with an embodiment includes a plurality of cell arrays CA1 and CA2, a plurality of dummy mats DMAT1 to DMAT4, row decoders XDEC1 and XDEC2, a latch block 100, column decoders YDEC1 and YDEC2, sense amplifiers IOSA1 and IOSA2, write driving blocks WTDRV1 and WTDRV2, repair latch blocks 110 and 120, an input/output control block 130, a command/address control block 140, a fuse block 150, a command/address generation block 155, and a refresh control block 160. The refresh control block 160 includes a command decoder 161, a row address counter 162, and a refresh counter 163.

The semiconductor device is driven by being divided into a plurality of banks. Each of the plurality of banks includes the plurality of cell arrays CA1 and CA2 and the plurality of dummy mats DMAT1 to DMAT4. The plurality of cell arrays CA1 and CA2 are arranged in a plurality of rows and columns, and form a plurality of rows of mats and a plurality of columns of mats. The row decoders XDEC1 and XDEC2 may select row lines of at least one of the plurality of the dummy mats DMAT 1 to DMAT 4 based on a row address XADD. The plurality of dummy mats DMAT1 to DMAT4 are formed in a predetermined region of the cell arrays CA1 and CA2. In particular, the plurality of dummy mats DMAT1 to DMAT4 may be disposed at the outermost peripheral regions of the plurality of cell arrays CA1 and CA2.

The plurality of cell arrays CA1 and CA2 each include a plurality of word lines and row lines, where the row lines are selected by the row decoders XDEC1 and XDEC2 based on the row address XADD. The plurality of cell arrays CA1 and CA2 include pluralities of bit lines and column lines, where the column lines and at least one of the dummy mats DMAT 1 to DMAT 4 are selected by the column decoders YDEC1 and YDEC2 corresponding to a column address YADD.

The latch block 100 stores fuse data for repairing failed cells of the plurality of cell arrays CA1 and CA2. To this end, the row address XADD, fuse data FD_L, a latch address LADD, a latch enable signal LEN, and fuse data FD are inputted into the latch block 100. The latch block 100 stores the fuse data FD_L which are applied from the dummy mats DMAT1 to DMAT4 in an update operation.

Although the latch block 100 is illustrated as configured separately from the row decoders XDEC1 and XDEC2, in other embodiments, the latch block 100 may be included in the row decoders XDEC1 and XDEC2.

The sense amplifiers IOSA1 and IOSA2 sense and amplify data applied from the plurality of cell arrays CA1 and CA2 in response to a read signal RD. The write driving blocks WTDRV1 and WTDRV2 drive inputted data and output the driven data to the plurality of cell arrays CA1 and CA2 in response to a write signal WT.

The repair latch blocks 110 and 120 store fuse data for repairing failed cells of the plurality of cell arrays CA1 and CA2 in a repair operation. To this end, the repair latch blocks 110 and 120 are coupled to a global line GIO, and receive the write signal WT, the column address YADD, the latch address LADD, the latch enable signal LEN, and the fuse data FD. The repair latch blocks 110 and 120 store the fuse data FD_L which are applied from the dummy mats DMAT1 to DMAT4 in the update operation.

Although the repair latch blocks 110 and 120 are configured separately from the column decoders YDEC1 and YDEC2, in an embodiment, the repair latch blocks 110 and 120 may be included in the column decoders YDEC1 and YDEC2.

The input/output control block 130 is inputted with the fuse data FD, and transfers the fuse data FD to the repair latch blocks 110 and 120 through the global line GIO. The input/output control block 130 may include a selection unit 131 which may select the fuse data FD applied from the fuse block 150 and the selection unit 131 outputs the fuse data FD to the global line GIO.

The selection unit 131 operates in response to a select signal SEL1 for selecting a normal operation and a boot-up operation. For example, if the select signal SEL1 is disabled in the normal operation, the selection unit 131 selects external data EDATA and outputs the external data EDATA to the global line GIO. Conversely, if the select signal SEL1 is enabled in the boot-up operation, the selection unit 131 selects the fuse data FD and outputs the fuse data FD to the global line GIO.

The command/address generation block 155 inputs the command/address control block 140 with a command signal CMD and an address ADD. The command/address control block 140 outputs an active signal ACT to the row decoders XDEC1 and XDEC2, and outputs the write signal WT to the repair latch blocks 110 and 120, the column decoders YDEC1 and YDEC2 and the write driving blocks WTDRV1 and WTDRV2, in one example, corresponding to the command signal CMD and the address ADD. The command/address control block 140 includes a selection unit 141 which selects the command signal CMD and the address ADD applied from the command/address generation block 155 and the selection unit 141 generates the active signal ACT and the write signal WT.

The selection unit 141 operates corresponding to a select signal SEL2 for selecting the normal operation and the boot-up operation. For example, if the select signal SEL2 is disabled in the normal operation, the selection unit 141 selects an external command signal ECMD and thereby controls the active signal ACT and the write signal WT. Conversely, if the select signal SEL2 is enabled in the boot-up operation, the selection unit 141 selects the command signal CMD and the address ADD and thereby controls the active signal ACT and the write signal WT.

The fuse block 150 may stored repair information corresponding to a failure address. Further, the fuse block 150 outputs the fuse data FD stored therein, to the latch block 100 and the repair latch blocks 110 and 120 in the boot-up operation. Further, the fuse block 150 outputs the latch address LADD and the latch enable signal LEN to the latch block 100 and the repair latch blocks 110 and 120. The fuse block 150 may be configured by an E-fuse array (ARE) in which fuse sets are arranged in the form of an array.

The command/address generation block 155 generates the command signal CMD and the address ADD, and outputs the command signal CMD and the address ADD to the command/address control block 140 during, in one example, the boot-up operation. While in one embodiment the command/address generation block 155 is disposed outside the fuse block 150, in other embodiments the command/address generation block 155 may be included in the fuse block 150.

The command decoder 161 decodes an external command signal, and generates a refresh signal REF and the read signal RD, where, in one embodiment, the refresh signal REF is enabled in a refresh operation. The row address counter 162 counts the refresh signal REF, generates a refresh address REFADD upon receiving the refresh signal REF, and outputs the refresh address REFADD to the row decoders XDEC1 and XDEC2. The refresh counter 163 counts the refresh signal REF and generates the row address XADD and the column address YADD.

The refresh counter 163 generates the row address XADD and the column address YADD to access addresses of cells in which the fuse data FD are stored. The refresh counter 163 may include therein a latch for latching the refresh signal REF.

The refresh counter 163 outputs the row address XADD to the row decoders XDEC1 and XDEC2 and the latch block 100. The refresh counter 163 outputs the column address YADD to the repair latch blocks 110 and 120, the column decoders YDEC1 and YDEC2, the sense amplifiers IOSA1 and IOSA2, and the write driving blocks WTDRV1 and WTDRV2. Accordingly, the refresh control block 160 is able to generate a refresh address REFADD and row address XADD for controlling at least one row decoder XDEC1 and XDEC2. Further, the refresh control block 160 may generate the column address XADD and the read signal RD.

As a degree of integration increases, semiconductor devices are being developed to have a fine pattern. In particular, a capacity of a memory device quickly increases as a degree of integration increases. An increase in memory capacity typically means an increase in the number of memory cells. As the number of memory cells increase, the number of memory cells where failures occur increases as well.

Because even one cell failure is not allowed, in preparation for occurrence of memory cell failures, normal redundant cells for replacing normal failed cells are included in a semiconductor device. Such an operation of replacing failed normal cells with normal redundant cells is referred to as a repair operation.

In detail, a repair address which represents the position of a failed normal cell may be found by using semiconductor test equipment. Programming fuses included in a repair fuse circuit may store the repair address.

After the repair address is stored in the repair fuse circuit, if an external address is input to access the failed normal cell from the exterior, it is determined whether the repair address and the external address are equal.

Accordingly, a normal path for accessing the failed normal cell is disabled and a redundant path is enabled by operations of the row decoders XDEC1 and XDEC2 and the column decoders YDEC1 and YDEC2. Therefore, the repair operation is performed in such a way as to block access to the failed normal cell and allow access to the redundant cell.

Thus, if a repaired word line becomes a refresh target, a replacement redundant word line of a redundant region is enabled such that an operation is performed normally after the repair operation.

Figure 2:
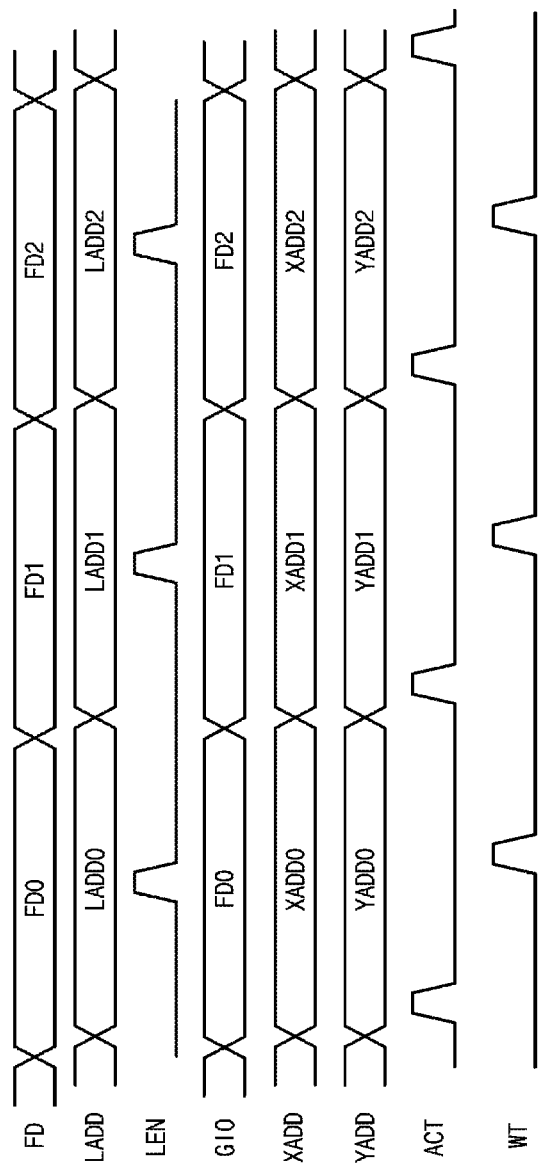
FIG. 2 is a representation of an example of a timing diagram to assist in the explanation of the operation of the semiconductor device shown in FIG. 1.

FIG. 2 is a representation of an example of a timing diagram to assist in the explanation of operations of the semiconductor device shown in FIG. 1.

During the boot-up operation, the fuse block 150 copies and latches repair information stored in local E-fuses in the core regions of the cell arrays CA1 and CA2. In the boot up operation, the fuse data FD stored in the fuse block 150 are outputted to the latch block 100, the repair latch blocks 110 and 120 and the input/output control block 130 in the boot-up operation.

That is to say, when fuse data FD is applied from the fuse block 150, addresses of failed cells are sequentially stored in the latch block 100 and the repair latch blocks 110 and 120. Then, when cells of the cell arrays CA1 and CA2 are accessed, redundancy cells are accessed instead by referring to the fuse data FD stored in the latch block 100 and the repair latch blocks 110 and 120.

Pluralities of latch blocks 100 and repair latch blocks 110 and 120 exist to store repair addresses. Since soft errors may occur in such latch blocks 100 and repair latch blocks 110 and 120, the latch blocks 100 and the repair latch blocks 110 and 120 may be configured with CCL type latches.

For example, a soft error means that as a circuit is exposed to peripheral radiation stored data is damaged causing an error. In this regard, when the latch block 100 and the repair latch blocks 110 and 120 are configured with CCL type latches, areas thereof increase when compared to general latches.

The operation of storing fuse data in the latch block 100 and the repair latch blocks 110 and 120 in the boot-up operation is performed only at an initial operation stage of the semiconductor device. Therefore, if soft errors occur in data of the latch block 100 and the repair latch blocks 110 and 120 during operation of the semiconductor device, there is no method capable of recovering the soft errors.

In consideration of this fact, in an embodiment, in the boot-up operation of the fuse block 150, the fuse data FD is not only sequentially stored in the latch block 100 and the repair latch blocks 110 and 120, but the fuse data FD is also stored in the dummy mats DMAT1 to DMAT4. Thereafter, in a refresh operation including updating and storing data of the latch block 100 and the repair latch blocks 110 and 120 by using the data, for example fuse data FD, stored in the dummy mats DMAT1 to DMAT4, it is possible to prevent an occurrence of a soft error.

For example, latches included in the latch block 100 and the repair latch blocks 110 and 120 are selected based on the latch address LADD which is outputted from the fuse block 150. The fuse data FD are stored in the selected latches of the latch block 100 and the repair latch blocks 110 and 120 based on the latch enable signal LEN which is outputted from the fuse block 150.

In the boot-up operation of the fuse block 150, the fuse data FD are stored in the dummy mats DMAT1 to DMAT4. To this end, the command/address generation block 155 outputs the command signal CMD and the address ADD to the command/address control block 140.

The command/address control block 140 enables the active signal ACT and the write signal WT in response to the command signal CMD and the address ADD. The command/address block 140 communicates the active signal ACT to the row decoders XDEC1 and XDEC2, and the command/address block 140 communicates the write signal WT to the column decoders YDEC1 and YDEC2 and the write driving blocks WTDRV1 and WTDRV2. Accordingly, as the row decoders XDEC1 and XDEC2, the column decoders YDEC1 and YDEC2 and the write driving blocks WTDRV1 and WTDRV2 operate, the fuse data FD may be stored in dummy cells of the dummy mats DMAT1 to DMAT4. In one particular example, the write driving blocks WTDRV1 and WTDRV2 may transfer the fuse data FD to the dummy mats DMAT1 to DMAT4 in response to a write signal WT in the boot-up operation.

In other words, in an embodiment, an exteriorly applied command signal and an address are not received in the boot-up operation. The active signal ACT and the write signal WT are enabled in response to the command signal CMD and the address ADD applied from the command/address generation block 155 when the select signal SEL2 is enabled, which causes the fuse data FD to be stored in the dummy mats DMAT1 to DMAT4.

Also, the row decoders XDEC1 and XDEC2 are enabled by receiving the row address XADD, and the column decoders YDEC1 and YDEC2 are enabled by receiving the column address YADD. The row address XADD and the column address YADD may be enabled in synchronization with the latch address LADD. When the select signal SEL1 is enabled, the input/output control block 130 operates to enable a path for storing the fuse data FD in the dummy mats DMAT1 to DMAT4 through the global line GIO.

Thereafter, in a refresh operation, data of the latch block 100 and the repair latch blocks 110 and 120 are updated by using the data stored in the dummy mats DMAT1 to DMAT4. As a consequence, an occurrence of a soft error may be prevented, and, even if a soft error occurs, it is possible to correct the soft error corresponding to the fuse data FD_L through accurate fuse information.

For example, the command decoder 161 decodes an external command signal and outputs the refresh signal REF to the row address counter 162 and the refresh counter 163.

If the refresh address REFADD is enabled by the row address counter 162, the row decoders XDEC1 and XDEC2 and the latch block 100 are enabled. The row address XADD and the column address YADD are enabled by the refresh counter 163.

Namely, in the refresh operation, the row address XADD and the column address YADD for accessing data are generated by the refresh counter 163. Then, the dummy mats DMAT1 to DMAT4, the repair latch blocks 110 and 120, the column decoders YDEC1 and YDEC2 and the sense amplifiers IOSA1 and IOSA2 are enabled. In response to the read signal RD applied from the command decoder 161, the sense amplifiers IOSA1 and IOSA2 perform operations for sensing the fuse data FD_L stored in the dummy mats DMAT1 to DMAT4.

Then, in response to a read signal RD in the refresh operation, data stored in the dummy mats DMAT1 to DMAT4 are transferred to the latch block 100 and the repair latch blocks 110 and 120 transferred through the column decoders YDEC1 and YDEC2 and the sense amplifiers IOSA1 and IOSA2. The latch data stored in the latch block 100 and the repair latch blocks 110 and 120 are updated.

In this way, when the data stored in the dummy mats DMAT1 to DMAT4 are updated and stored in the latch block 100 and the repair latch blocks 110 and 120, the dummy mats DMAT1 to DMAT4 and the cell arrays CA1 and CA2 may share input/output lines. In this case, data stored in the latch block 100 and the repair latch blocks 110 and 120 may be periodically updated in the refresh operation.

Hence, in an embodiment, by updating data, for example the fuse data FD_L, of the latch block 100 and the repair latch blocks 110 and 120 corresponding to the data stored by the dummy mats DMAT1 to DMAT4 in the refresh operation, it is possible to prevent an occurrence of a soft error. In addition, the area of the latches included in the latch block 100 and the repair latch blocks 110 and 120 may be reduced.

Figure 3:
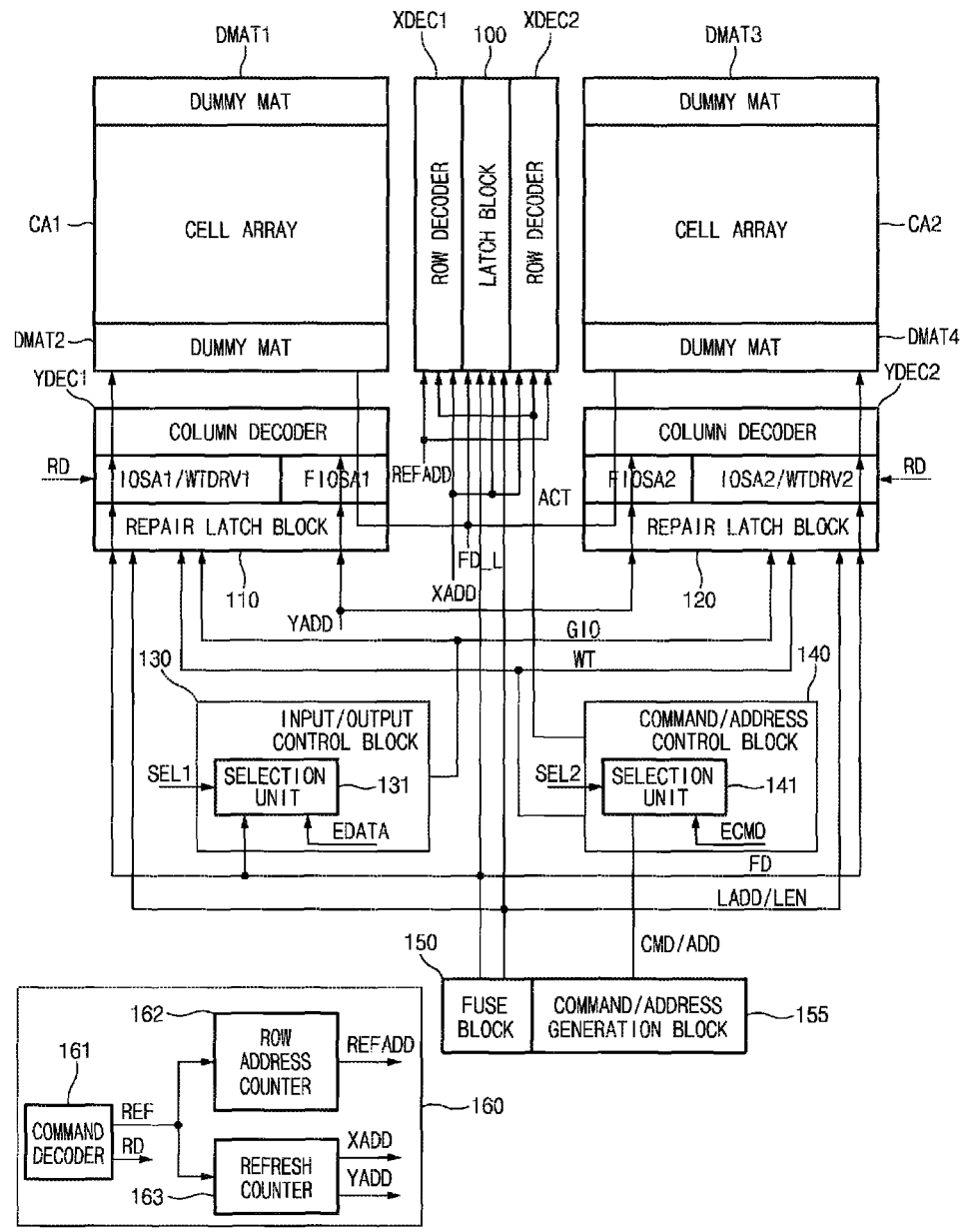
FIG. 3 is a configuration diagram illustrating a representation of an example of a semiconductor device in accordance with another embodiment.

FIG. 3 is a configuration diagram illustrating a representation of an example semiconductor device in accordance with another embodiment.

When data stored in the dummy mats DMAT1 to DMAT4 are updated and stored in the latch block 100 and the repair latch blocks 110 and 120, the dummy mats DMAT1 to DMAT4 and the cell arrays CA1 and CA2 may not share input/output lines and may use different input/output lines separate from each other.

When dummy mats DMAT1 to DMAT4 and the cell arrays CA1 and CA2 share input/output lines, the fuse data FD_L may be updated in the refresh operation in which a normal read or normal write command is not applied. However, when the dummy mats DMAT1 to DMAT4 and the cell arrays CA1 and CA2 use different input/output lines, the fuse data FD_L may be updated separately from a normal read or normal write operation.

Accordingly, as shown in FIG. 3, by including separate sense amplifiers FIOSA1 and FIOSA2 that form separate paths through which the fuse data FD_L may be periodically read, and data of the latch block 100 and the repair latch blocks 110 and 120 may be updated even when the refresh operation is not performed.

Figure 4:
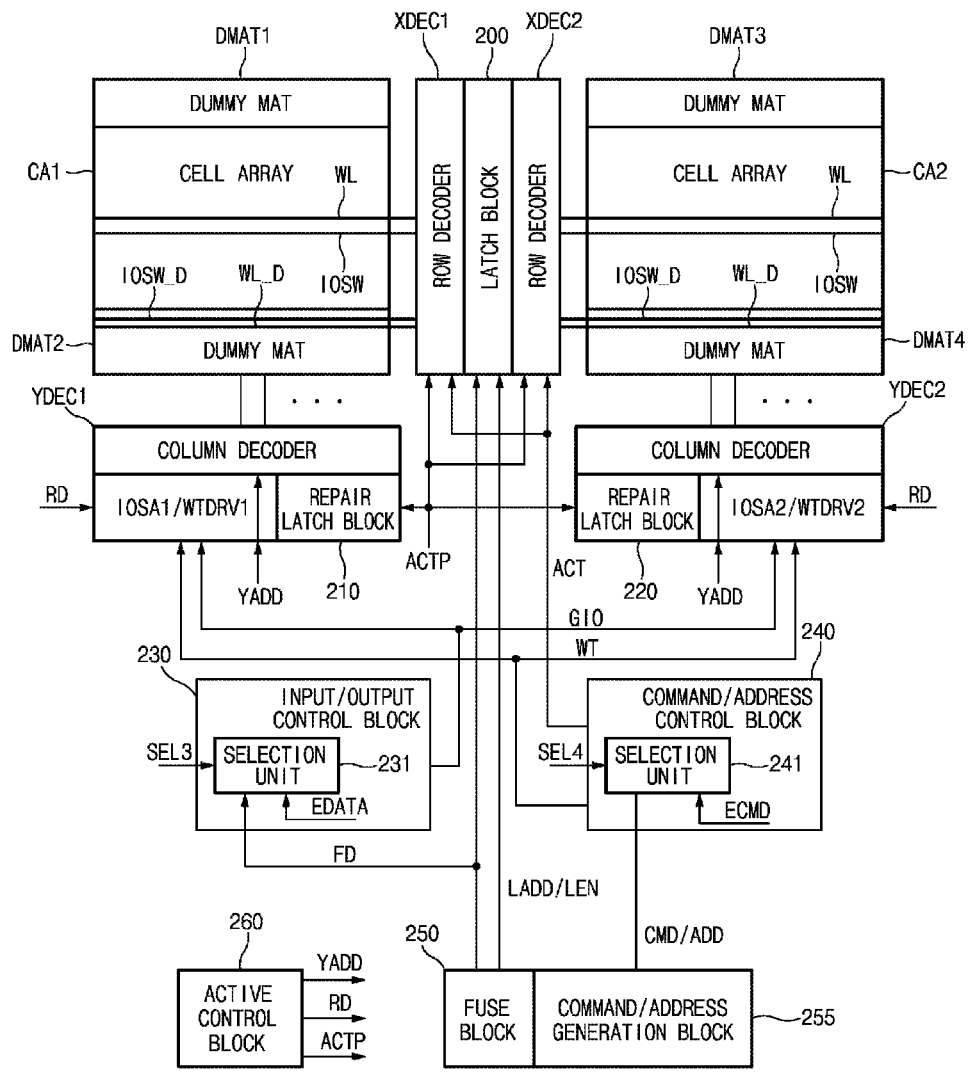
FIG. 4 is a configuration diagram illustrating a representation of an example of a semiconductor device in accordance with still another embodiment.

FIG. 4 is a configuration diagram illustrating a representation of an example semiconductor device in accordance with yet another embodiment.

A semiconductor device in accordance with yet another embodiment shown in FIG. 4 includes a plurality of cell arrays CA1 and CA2, a plurality of dummy mats DMAT1 to DMAT4, row decoders XDEC1 and XDEC2, a latch block 200, column decoders YDEC1 and YDEC2, sense amplifiers IOSA1 and IOSA2, write driving blocks WTDRV1 and WTDRV2, repair latch blocks 210 and 220, an input/output control block 230, a command/address control block 240, a fuse block 250, a command/address generation block 255, and an active control block 260.

The semiconductor device is driven by being divided into a plurality of banks. Each of the plurality of banks includes the plurality of cell arrays CA1 and CA2 and the plurality of dummy mats DMAT1 to DMAT4. The plurality of cell arrays CA1 and CA2 are arranged in plural numbers in a row direction and a column direction, and form a plurality of rows of mats and a plurality of columns of mats. The row decoders XDEC1 and XDEC2 may select row lines of at least one of the plurality of the dummy mats DMAT 1 to DMAT 4 based on a row address XADD. The plurality of dummy mats DMAT1 to DMAT4 are formed in a predetermined region of the cell arrays CA1 and CA2. In one example, the plurality of dummy mats DMAT1 to DMAT4 may be disposed at the outermost peripheral regions of the plurality of cell arrays CA1 and CA2.

The plurality of cell arrays CA1 and CA2 each include a plurality of word lines and row lines, where the row lines are selected by the row decoders XDEC1 and XDEC2 based on a row address. The plurality of cell arrays CA1 and CA2 include pluralities of bit lines and column lines, where the column lines and at least one of the dummy mats DMAT 1 to DMAT 4 are selected by the column decoders YDEC1 and YDEC2 corresponding to a column address YADD.

The latch block 200 stores fuse data for repairing failed cells of the plurality of cell arrays CA1 and CA2. To this end, a latch address LADD, a latch enable signal LEN, and fuse data FD are inputted into the latch block 200.

Although the latch block 200 is illustrated as configured separately from the row decoders XDEC1 and XDEC2, in other embodiments, the latch block 200 may be included in the row decoders XDEC1 and XDEC2.

The sense amplifiers IOSA1 and IOSA2 sense and amplify data applied from the plurality of cell arrays CA1 and CA2 in response to a read signal RD. The write driving blocks WTDRV1 and WTDRV2 drive inputted data and output the driven data to the plurality of cell arrays CA1 and CA2 in response to a write signal WT. The column decoders YDEC1 and YDEC2, the sense amplifiers IOSA1 and IOSA2, and the write driving blocks WTDRV1 and WTDRV2 are inputted with a column address YADD and the read signal RD, and are coupled to a global line GIO.

The repair latch blocks 210 and 220 store fuse data for repairing the failed cells of the plurality of cell arrays CA1 and CA2 in a repair operation. The repair latch blocks 210 and 220 receive and store the fuse data FD from the dummy mats DMAT1 to DMAT4 after an active signal ACTP is enabled corresponding to enablement of the read signal RD.

In the present embodiment, the repair latch blocks 210 and 220 receive and store the fuse data FD through the sense amplifiers IOSA1 and IOSA2. In one example, the repair latch blocks 210 and 220 receive and store fuse data FD from the dummy mats DMAT1 to DMAT4 after the active signal ACTP is enabled when a first data strobe signal is enabled as the read signal RD is enabled.

Although the repair latch blocks 210 and 220 are configured separately from the column decoders YDEC1 and YDEC2, in an embodiment, the repair latch blocks 210 and 220 may be included in the column decoders YDEC1 and YDEC2. In the present embodiment, the repair latch blocks 210 and 220 may be formed in regions adjacent to the sense amplifiers IOSA1 and IOSA2.

The input/output control block 230 is inputted with the fuse data FD, and transfers the fuse data FD to the column decoders YDEC1 and YDEC2 through the global line GIO. The input/output control block 230 may include a selection unit 231, which may select the fuse data FD applied from the fuse block 250 and the selection unit 231 outputs the fuse data FD to the global line GIO.

The selection unit 231 selectively outputs external data EDATA or the fuse data FD corresponding to a select signal SEL3 for selecting a normal operation or a boot-up operation. For example, in normal operation the select signal SEL3 is disabled, thus the selection unit 231 selects the external data EDATA, and the input/output control block 230 and outputs the external data EDATA to the global line GIO. Conversely, in the boot-up operation the select signal SEL3 is enabled, thus the selection unit 231 selects the fuse data FD, and the input/output control block 230 and outputs the fuse data FD to the global line GIO.

The command/address generation block 255 inputs the command/address control block 240 with a command signal CMD and an address ADD. The command/address control block 240 outputs an active signal ACT to the row decoders XDEC1 and XDEC2, and outputs the write signal WT to the column decoders YDEC1 and YDEC2 and the write driving blocks WTDRV1 and WTDRV2, in one example, corresponding to the command signal CMD and the address ADD. The command/address control block 240 includes a selection unit 241, which selects the command signal CMD and the address ADD applied from the command/address generation block 255 and the selection unit 241 generates the active signal ACT and the write signal WT.

The selection unit 241 operates in correspondence to a select signal SEL4 for selecting the normal operation and the boot-up operation. For example, if the select signal SEL4 is disabled in the normal operation, the selection unit 241 selects the command signal CMD and the address ADD and thereby controls the active signal ACT and the write signal WT. Conversely, if the select signal SEL4 is enabled in the boot-up operation, the selection unit 241 selects an external command signal ECMD and thereby controls the active signal ACT and the write signal WT.

The fuse block 150 may store repair information corresponding to a failure address. Further, the fuse block 250 outputs the fuse data FD stored therein, to the latch block 200 and the input/output control block 230 in the boot-up operation. Further, the fuse block 250 outputs the latch address LADD and the latch enable signal LEN to the latch block 200. The fuse block 250 may be configured by an E-fuse array (ARE) in which fuse sets are arranged in the form of an array.

When fails occur in the cell arrays CA1 and CA2, addresses where the failures have occurred are stored in latches. If fail addresses are applied to the latches, the corresponding addresses are not accessed and redundancy addresses replace the failed addresses. In this way, the fuse block 250 stores addresses of cells where failures occur, in fuse sets.

A number of redundancies are used to repair a number of cells. When failure addresses of the fuse block 250 are stored in all of the latch block 200 and the repair latch blocks 210 and 220 in the boot-up operation, a large number of latches are needed and thus an area increases so that the large number of latches may be accommodated.

Accordingly, in the present embodiment, during the boot-up operation fuse data information stored in the fuse block 250 is stored in the latch block 200 and the dummy mats DMAT1 to DMAT4. Moreover, in order to reduce the area of the repair latch blocks 210 and 220, not all repair information is stored in the repair latch blocks 210 and 220, but only fuse data information of a specific column repair unit corresponding to a read signal RD, when an active signal ACT is enabled, is stored in the repair latch blocks 210 and 220.

For example, if a column address has 10 address bits, 7 address bits among the 10 address bits are needed to access a column line. Therefore, 8 total signal bits should be stored as repair information. In one example, the 8 bits include the 7 address bits for storing a fail address and a 1-bit enable signal as a bit signal for representing whether or not a fuse is used.

Assuming that the number of redundancy column select signals is 3, a space for storing 8×3=24 bits of information is needed. Also, in the case of column repair, a repair operation is performed based on a mat to be activated.

That is to say, if the number of column repair lines corresponding to a first mat is 3, the repair operation may be performed three times in a column direction in the first mat. Since a second mat includes 3 column repair lines independently of the first mat, the repair operation may be performed three times in the column direction in the second mat as well. Therefore, a space capable of storing column repair information corresponding to 8 bits×3 redundancies×the number of mats (N) is needed.

While column repair lines are physically coupled, only fuse information of a corresponding mat becomes valid by an external select signal in an active operation. In the present embodiment, by storing only failure address information corresponding to a dummy mat in the repair latch blocks 210 and 220, the number of latches may be decreased and an area of the semiconductor device may be reduced. In other words, the repair latch blocks 210 and 220 in accordance with the present embodiment store only column repair information corresponding to 1 set of dummy mats (for example, 24 bit information) by a specified column repair unit. Further, the repair latch blocks 210 and 220 may store column repair information of a next dummy mat based on the column select signal.

The command/address generation block 255 generates the command signal CMD and the address ADD, and outputs the command signal CMD and the address ADD to the command/address control block 240. While the command/address generation block 255 is illustrated as disposed outside the fuse block 250 in this embodiment, other embodiments are not limited to such an example and the command/address generation block 255 may be included in the fuse block 250.

The active control block 260 controls active states of the column address YADD, the read signal RD, and the active signal ACTP in correspondence to a command signal and address which are externally received.

The operation of the semiconductor device in accordance with the embodiment of FIG. 4 and configured as mentioned above, is described below.

During the boot-up operation, the fuse block 250 copies and latches repair information stored in local E-fuses, in the core regions of the cell arrays CA1 and CA2. In the boot-up operation, the fuse data FD stored in the fuse block 250 are outputted to the latch block 200 and the input/output control block 130 in the boot-up operation.

That is to say, when fuse data FD is applied from the fuse block 250, addresses of failed cells are sequentially stored in the latch block 200 and the dummy mats DMAT1 to DMAT4. Then, when cells of the cell arrays CA1 and CA2 are accessed, redundancy cells are accessed instead by referring to the fuse data FD stored in the latch block 200 and the dummy mats DMAT1 to DMAT4. Pluralities of latch blocks 200 and repair latch blocks 210 and 220 exist to store repair addresses.

In the present embodiment, in the boot-up operation of the fuse block 250, the fuse data FD are not only sequentially stored in the latch block 200, but also are stored in the dummy mats DMAT1 to DMAT4. In the active operation, the data stored in the dummy mats DMAT1 to DMAT4 are transferred to and stored in the repair latch blocks 210 and 220 only for a predetermined time.

For example, the latch block 200 is selected in correspondence to the latch address LADD which is outputted from the fuse block 250. The fuse data FD are stored in the latch block 200 in correspondence to the latch enable signal LEN which is outputted from the fuse block 250.

During the fuse block 250 boot-up operation, the fuse data FD are stored in the dummy mats DMAT1 to DMAT4. To this end, the command/address generation block 255 outputs the command signal CMD and the address ADD to the command/address control block 240 in the boot-up operation.

The command/address control block 240 enables the active signal ACT and the write signal WT in response to receiving the command signal CMD and the address ADD. Accordingly, as the row decoders XDEC1 and XDEC2, the column decoders YDEC1 and YDEC2, and the write driving blocks WTDRV1 and WTDRV2 operate, the fuse data FD may be stored in dummy cells of the dummy mats DMAT1 to DMAT4. In particular, the write drive blocks WTDRV1 and WTDRV2 may transfer fuse data FD to the dummy mats DMAT1 to DMAT4 in response to a write signal WT during the boot-up operation.

In other words, in the embodiment, an exteriorly applied command signal and an address are not received in the boot-up operation. When the select signal SEL4 is enabled, the active signal ACT and the write signal WT are enabled in response to the command signal CMD and the address ADD applied from the command/address generation block 255, and the fuse data FD are stored in the dummy mats DMAT1 to DMAT4. Namely, when the select signal SEL3 is enabled, the input/output control block 230 operates, and enables a path for storing the fuse data FD in the dummy mats DMAT1 to DMAT4 through the global line GIO.

Thereafter, when the active signal ACTP is enabled and the read signal SD is enabled, the sense amplifiers IOSA1 and IOSA2 operate. Then, the column repair information stored in the dummy mats DMAT1 to DMAT4 is stored in the repair latch blocks 210 and 220.

In the present embodiment, the active signal ACT may be a signal which is enabled in a boot-up path through which the fuse data FD are stored in the dummy mats DMAT1 to DMAT4. The active signal ACTP may also be a signal which is enabled in a read path through which the fuse data FD stored in the dummy mats DMAT1 to DMAT4 are stored in the repair latch blocks 210 and 220.

Figure 5:
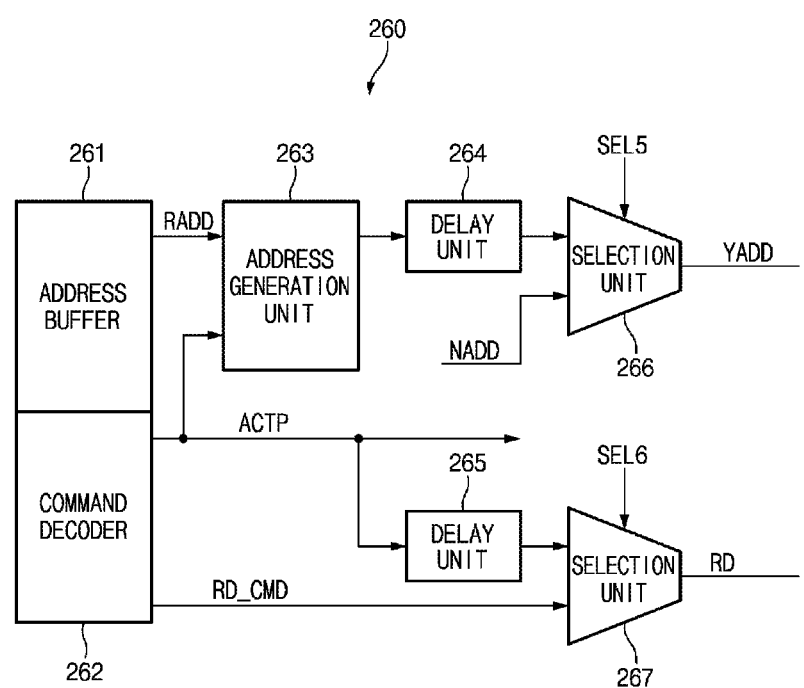
FIG. 5 is a detailed configuration diagram illustrating a representation of an example of the active control block shown in FIG. 4.

FIG. 5 is a detailed configuration diagram illustrating a representation of an example of the active control block 260 shown in FIG. 4.

The active control block 260 includes an address buffer 261, a command decoder 262, an address generation unit 263, delay units 264 and 265, and selection units 266 and 267. The address generation unit 263, delay units 264 and 265, and the selection units 266 and 267 may be comprised of switches, control blocks, gates, semiconductors or any other type of semiconductor apparatus capable of receiving at least one input and outputting a resultant output.

The address buffer 261 buffers an input address, and generates a row address RADD to the address generation unit 263. The address generation unit 263 generates an address, for example a column address YADD, in correspondence to the row address RADD and the active signal ACTP.

The delay unit 264 delays the output address of the address generation unit 263 for a predetermined time, and outputs a resultant signal. The delay unit 264 may delay the output address of the address generation unit 263 by a time corresponding to a tRCD (a RAS to CAS delay).

The selection unit 266 selects the output of the delay unit 264 or a normal address NADD in correspondence to a select signal SEL5, and outputs the column address YADD. The normal address NADD may be a column address which is used in a normal mode. The column address YADD is enabled after the row address RADD is enabled and after a delay is made by the time corresponding to the tRCD.

For example, when the select signal SEL5 is a high level, the selection unit 266 selects output of the delay unit 264 and thereby outputs the column address YADD which is generated by delaying the row address RADD. Conversely, when the select signal SEL5 is a low level, the selection unit 266 outputs a normal address NADD as the column address YADD.

The command decoder 262 decodes an external command signal, and outputs the active signal ACTP and a read command signal RD_CMD. The command decoder 262 outputs the active signal ACTP to the address generation unit 263, the row decoders XDEC1 and XDEC2 (see, for example, FIG. 4), and the delay unit 265, and outputs the read command signal RD_CMD to the selection unit 267.

The delay unit 265 delays the active signal ACTP by a predetermined time, and outputs a resultant signal which may be a read signal. The delay unit 265 may delay the active signal ACTP corresponding to the time tRCD (the RAS to CAS delay). That is to say, the delay unit 265 delays the active signal ACTP for a time during which a read operation may be performed after a RAS signal is enabled. The delay unit 265 then outputs a resultant signal.

The selection unit 267 selects output of the delay unit 265 or the read command signal RD_CMD in correspondence to a select signal SEL6, and outputs the read signal RD. The read command signal RD_CMD may be used in the normal mode. The read signal RD is enabled after a delay for a time corresponding to the tRCD after the active signal ACTP is enabled.

For example, when the select signal SEL6 is a high level, the selection unit 267 selects output of the delay unit 265 and outputs the read signal RD. The read signal RD may be generated by delaying the active signal ACTP. Conversely, when the select signal SEL6 is a low level, the selection unit 267 selects the read command signal RD_CMD and outputs the read signal RD.

In the present embodiment, column repair information is stored in the dummy mats DMAT1 to DMAT4. Therefore, when the active signal ACTP is enabled, the address of the dummy mats DMAT1 to DMAT4 where the column repair information is stored should also be enabled.

In other words, 2 word lines should be enabled in the active operation. For example, a normal word line WL of the cell array CA1 and a dummy word line WL_D of the dummy mat DMAT2 should be enabled simultaneously during the active operation. In one embodiment, the active control block 260 enables a word line WL of the cell array CA1 after a predetermined delay from when the dummy word line WL_D of the dummy mat DMAT2 is enabled.

In this way, if 2 addresses are enabled simultaneously to simultaneously enable the 2 word lines WL and WL_D, input/output lines may overlap. Therefore, times at which an input/output line IOSW of the cell array CA1 and an input/output line IOSW_D of the dummy mat DMAT2 should be enabled separately at different times. Accordingly, in an embodiment the active control block 260 enables word lines WL and WL_D and input/output lines IOSW of a cell array CA1 and CA2 and the dummy mat DMAT1 to DMAT4 for a predetermined time interval when the active signal ACTP is enabled.

The input/output line IOSW_D which operates according to the read signal RD is enabled at a time when a first internal read command signal RD_CMD is enabled. Then, after the first internal read command signal RD_CMD is disabled, the input/output line IOSW is enabled as the read signal RD is enabled, where the read signal RD is generated by delaying the active signal ACTP.

After reading the column repair information from the dummy mats DMAT1 to DMAT4 and storing the column repair information in the repair latch blocks 210 and 220, the dummy word line WL_D may be precharged. Also, when precharging the word line WL after a precharge command is applied, the dummy word line WL_D may be precharged together with the word line WL.

Figure 6:
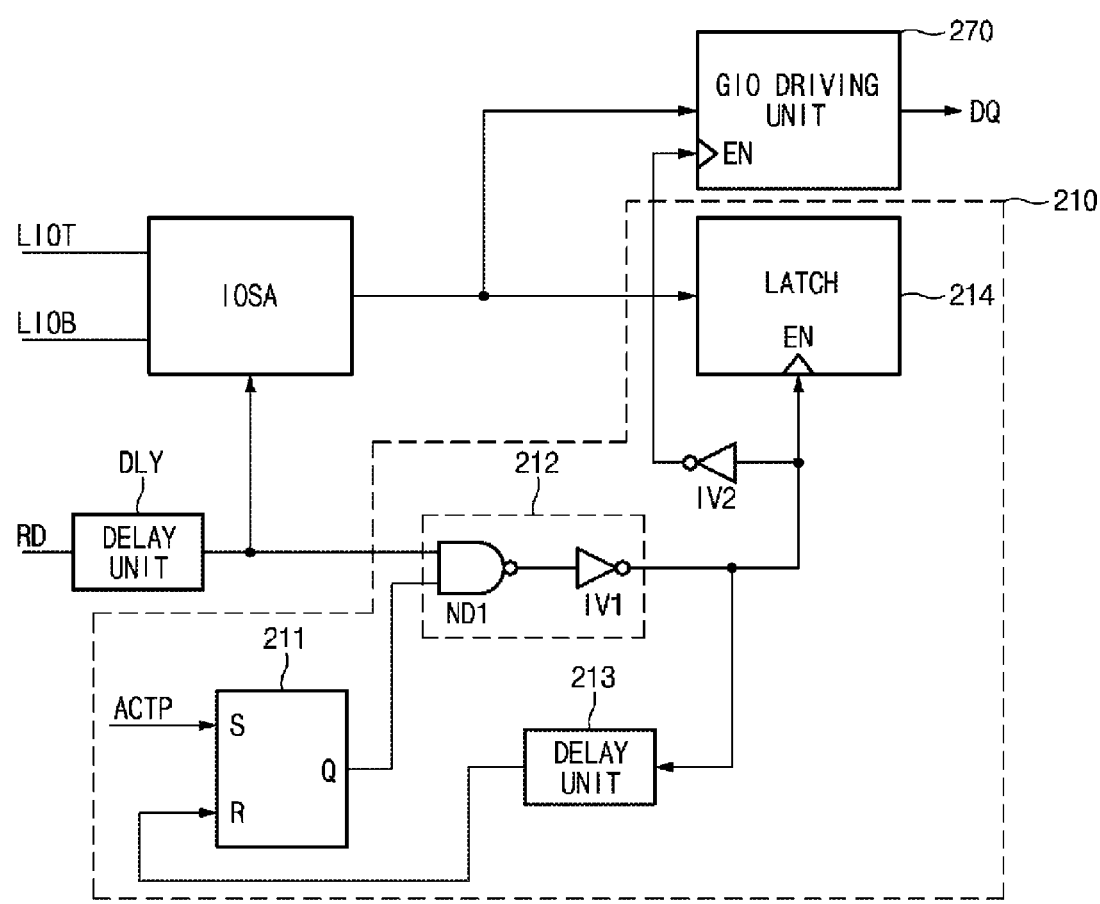
FIG. 6 is a detailed configuration diagram illustrating a representation of an example of the repair latch block shown in FIG. 4.

FIG. 6 is a detailed configuration diagram illustrating a representation of an example of the repair latch blocks 210 and 220 shown in FIG. 4. Since the configurations of the repair latch blocks 210 and 220 are the same, in the embodiment shown in FIG. 6, a configuration of the repair latch block 210 will be described as an example.

The repair latch block 210 includes an input unit 211, a combination unit 212, a delay unit 213, and a latch 214. The input unit 211 latches the active signal ACTP, and outputs a resultant signal. When the output of the delay unit 213 is a high level, the input unit 211 is reset by a reset signal.

A delay unit DLY delays the read signal RD, and outputs a resultant signal to the combination unit 212 and a sense amplifier IOSA. The combination unit 212 combines the output of the delay unit DLY and the output of the input unit 211, and outputs a resultant signal to the delay unit 213 and the latch 214.

The combination unit 212 ANDs or performs an AND logic function on the output of the delay unit DLY and the output of the input unit 211. In other words, the combination unit 212 enables the latch 214 when both the output of the delay unit DLY and the active signal ACTP are in enabled states.

To this end, the combination unit 212 includes a NAND gate ND1 and an inverter IV1. The NAND gate ND1 NANDs or performs a NAND logic function on the output of the delay unit DLY and the output of the input unit 211. The inverter IV1 inverts the output of the NAND gate ND1, and outputs a resultant signal to the latch 214 and the delay unit 213.

The sense amplifier IOSA senses and amplifies the data read from the cell arrays CA1 and CA2 when the output of the delay unit DLY is enabled. The sense amplifier IOSA may be coupled to the cell arrays CA1 and CA2 through local input/output lines LIOT and LIOB. A global line driving unit 270 drives the data read from the sense amplifier IOSA, and outputs output data DQ.

If the delay time of the delay unit 213 exceeds a time when the latch 214 is enabled, a reset signal R of the input unit 211 is enabled is output by the delay unit 213. Accordingly, as output of the combination unit 212 is disabled, the latch 214 enters a disabled state.

Namely, after the active operation, contents of the fuse data of the dummy mats DMAT1 to DMAT4 are outputted to the repair latch block 210 by a first read command. Preparation for storing the fuse data in the latch 214 is made before the active signal ACTP is enabled and the read signal RD is enabled. In one particular example, a path through which fuse data are stored in the latch 214 is blocked for a predetermined time after the read signal RD is enabled.

Thereafter, if the active signal ACTP is enabled and a read command enables a first read signal RD, the latch 214 is enabled and data applied from the sense amplifier IOSA are stored. Then, if the delay time of the delay unit 213 passes, the input unit 211 is reset.

Accordingly, the latch 214 enters a disabled state, and data applied from the sense amplifier IOSA are transferred to the global line driving unit 270. Thus, output data DQ are outputted. Therefore, the data stored in the latch 214 is retained without being changed.

The latch 214 and the global line driving unit 270 are driven in an inverted manner by an inverter IV2. Thus, the global line driving unit 270 enters disabled state when the latch 214 is enabled, and enters an enabled state when the latch 214 is disabled. The input unit 211, the combination unit 212, and the delay unit 213 may be comprised of switches, control blocks, gates, semiconductors or any other type of semiconductor apparatus capable of receiving at least one input and outputting a resultant output.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
a fuse block configured to store repair information corresponding to a failure address, and output fuse data in a boot-up operation;
a dummy mat formed in a predetermined region of a cell array, and configured to store the fuse data in the boot-up operation; and
a repair latch block configured to store the fuse data in the boot-up operation,
wherein the fuse data stored in the dummy mat are updated to and stored in the repair latch block in a refresh operation,
wherein the repair latch block stores the fuse data in a latch in the case where an active signal and a read signal are enabled, and a path through which the fuse data are stored in the latch is blocked for a predetermined time after the read signal is enabled.

2. The semiconductor device according to claim 1, further comprising:
a sense amplifier configured to transfer the fuse data applied from the dummy mat, to the repair latch block, in response to the read signal in the refresh operation; and
a write driving block configured to transfer the fuse data to the dummy mat in response to a write signal in the boot-up operation.

3. The semiconductor device according to claim 1, further comprising:

a row decoder configured to select row lines of the cell array and the dummy mat corresponding to a row address;

a latch block configured to store fuse data in the boot-up operation, and be updated with and store fuse data applied from the dummy mat in the refresh operation; and a column decoder configured to select column lines of the cell array and the dummy mat corresponding to a column address.

4. The semiconductor device according to claim 3, further comprising:

an input/output control block configured to output the fuse data to the repair latch block through a global line;

a command/address generation block configured to generate a command signal and an address in the boot-up operation; and a command/address control block configured to output the active signal to the row decoder and output the write signal to the write driving block, corresponding to the command signal and the address.

5. The semiconductor device according to claim 3, further comprising:

a refresh control block configured to generate a refresh address and the row address for controlling the row decoder, and the column address and the read signal.

6. The semiconductor device according to claim 5, wherein the refresh control block comprises:

a command decoder configured to decode an external command signal, and output a refresh signal which is enabled in the refresh operation and the read signal;

a row address counter configured to generate the refresh address corresponding to the refresh signal, and output the refresh address to the row decoder; and a refresh counter configured to count the refresh signal, and generate the row address and the column address.

7. The semiconductor device according to claim 1, wherein the fuse block comprises an E-fuse array (ARE) in which fuse sets are arranged in the form of an array.

8. The semiconductor device according to claim 1, further comprising:

a sense amplifier configured to form a separate path through which the fuse data are transferred to the repair latch block, in the case where the dummy mat and the cell array respectively use different input/output lines.

9. A semiconductor device comprising:

a fuse block configured to store repair information corresponding to a failure address, and output fuse data in a boot-up operation;

a dummy mat formed in a predetermined region of a cell array, and configured to store the fuse data in the boot-up operation; and a repair latch block configured to store the fuse data applied from the dummy mat by a specific column repair unit corresponding to a read signal when an active signal is enabled, wherein the repair latch block stores the fuse data in a latch in the case where the active signal and the read signal are enabled, and a path through which the fuse data are stored in the latch is blocked for a predetermined time after the read signal is enabled.

10. The semiconductor device according to claim 9, wherein the repair latch block stores column repair information corresponding to 1 set of dummy mats by the specified column repair unit, and stores column repair information of a next dummy mat based on a column select signal.

11. The semiconductor device according to claim 9, further comprising:

a row decoder configured to select row lines of the cell array and the dummy mat corresponding to a row address;

a latch block configured to store fuse data in the boot-up operation; and a column decoder configured to select column lines of the cell array and the dummy mat corresponding to a column address.

12. The semiconductor device according to claim 11, further comprising:

an input/output control block configured to output the fuse data to the column decoder through a global line;

a command/address generation block configured to generate a command signal and an address in the boot-up operation; and a command/address control block configured to output the active signal to the row decoder and output a write signal to a write driving block, corresponding to the command signal and the address.

13. The semiconductor device according to claim 11, further comprising:

an active control block configured to control the column address, the read signal and the active signal.

14. The semiconductor device according to claim 13, wherein the active control block enables word lines and input/output lines of the cell array and the dummy mat with a predetermined time interval when the active signal is enabled.

15. The semiconductor device according to claim 14, wherein the active control block enables the word line of the cell array after a predetermined delay time from when the word line of the dummy mat is enabled.

16. The semiconductor device according to claim 13, wherein the active control block comprises:

an address buffer configured to buffer an input address and generate a row address;

an address generation unit configured to generate the column address corresponding to the row address and the active signal;

a first delay unit configured to delay the column address applied from the address generation unit, for a predetermined time; and a second delay unit configured to delay the active signal by a predetermined time, and output the read signal.

17. The semiconductor device according to claim 16, wherein the active control block further comprises:

a command decoder configured to generate the active signal and a read command signal.

18. The semiconductor device according to claim 16, wherein the active control block further comprises:

a first selection unit configured to select an output of the first delay unit or a normal address corresponding to a first select signal; and a second selection unit configured to select an output of the second delay unit or the read command signal corresponding to a second select signal.

19. The semiconductor device according to claim 9, wherein the repair latch block comprises:

an input unit configured to latch the active signal, and be reset by a reset signal;

a combination unit configured to combine a delayed signal of the read signal and an output signal of the input unit, and control an enable operation of the latch; and a delay unit configured to delay an output signal of the combination unit by a predetermined time, and output the reset signal.

* * * * *